United States Patent
Solie

(10) Patent No.: US 6,559,739 B2
(45) Date of Patent: May 6, 2003

(54) STRING WEIGHTED SURFACE ACOUSTIC WAVE TRANSDUCER

(75) Inventor: Leland P. Solie, Apopka, FL (US)

(73) Assignee: Sawtek, Inc., Orlando, FL (US)

( * ) Notice: Subject to any disclaimer, the term of this patent is extended or adjusted under 35 U.S.C. 154(b) by 0 days.

(21) Appl. No.: 09/972,022

(22) Filed: Oct. 5, 2001

(65) Prior Publication Data

US 2003/0067370 A1 Apr. 10, 2003

(51) Int. Cl.[7] .......................... H03H 9/145; H03H 9/64
(52) U.S. Cl. ..................... 333/196; 310/313 B
(58) Field of Search ...................... 333/193–196; 310/313 R, 313 B

(56) References Cited

U.S. PATENT DOCUMENTS

| | | | | |
|---|---|---|---|---|
| 3,675,054 A | * | 7/1972 | Jones et al. | 310/313 B |
| 4,746,882 A | * | 5/1988 | Solie | 333/196 |
| 5,818,310 A | | 10/1998 | Solie | 333/196 |
| 5,831,492 A | | 11/1998 | Solie | 333/193 |

FOREIGN PATENT DOCUMENTS

| | | | | |
|---|---|---|---|---|
| JP | 61-220509 | * | 9/1986 | 333/193 |

OTHER PUBLICATIONS

L.P. Solie, "A SAW Filter Bank Using Hyperbolically Tapered Transducers"; IEEE Utrasonics Symposium, Unisys Corp, St. Paul, MN; pp. 83–86; 1988, no month.

C.B. Saw and C.K. Campbell; "Improved Design of Single-Phase Unidirectional Transducers for Low–Loss SAW filters"; IEEE Ultrasonics Symposium, pp. 169–172; 1987, no month.

Leland Solie, "Tapered Transducers–Design and Applications"; IEEE Ultrasonics Symposium, pp. 27–37; 1998, no month.

* cited by examiner

Primary Examiner—Barbara Summons
(74) Attorney, Agent, or Firm—Allen, Dyer, Doppelt, Milbrath & Gilchrist, P.A.

(57) ABSTRACT

Surface-acoustic-wave transducers include interdigital electrode fingers alternately connected to hot and ground bus bars. The gap between two adjacent electrodes has a relative tap weight proportional to the voltage difference between the two electrodes. A set of subtransducers connected in series, a string, has two ends that are connected to the major bus bars; several strings are connectable to a single pair of major bus bars. In string weighting a plurality of strings make up the number of different tap weights within the transducer. Here every subtransducer is preferably of minimal length, for example, nominally one wavelength. Since the full bus bar voltage is divided equally between the N subtransducers, the voltage at each tap is 1/N, and the length of the string is nominally N+1 wavelengths. Therefore, for a length of the transducer all taps have the same tap weight within each string.

3 Claims, 3 Drawing Sheets

STRING WEIGHTED SURFACE ACOUSTIC WAVE TRANSDUCER

BACKGROUND OF INVENTION

1. Field of Invention

The invention relates generally to surface acoustic wave transducers, and more particularly to transducers using string weighting for impedance transformation with improved rejection properties.

2. Background Art

The use of surface-acoustic-wave (SAW) devices as filters or resonators is well known for having the advantages of high Q, low series resistance, small size, and good frequency-temperature stability when compared with other frequency control methods such as LC circuits, coaxial delay lines, or metal cavity resonators. As described in U.S. Pat. No. 4,600,905 to Fredricksen, typically, a SAW device contains a substrate of piezoelectric material such as quartz, lithium niobate, or zinc oxide. Input and output transducers are formed upon the substrate. The transducers convert input electrical signals to surface acoustic waves propagating upon the surface of the substrate and then reconvert the acoustic energy to an electric output signal. The input and output transducers are configured as interdigital electrode fingers that extend from pairs of transducer pads, with the electrodes alternately connected to the hot and the ground bus bars, which forms an unweighted transducer. Interdigital transducers may be formed by depositing and patterning a thin film of electrically conductive material upon the piezoelectric substrate.

Alternating electrical potential coupled to the input interdigital transducer induces mechanical stresses in the substrate. The resulting strains propagate away from the input transducer along the surface of the substrate in the form of surface acoustic waves. These propagating surface waves arrive at the output interdigital transducer, where they are converted to electrical signals.

The basic tapered transducer has been reported in the literature and in particular in an article by P. M. Naraine and C. K. Campbell ("Wideband Linear Phase SAW Filters Using Apodized Slanted Finger Transducers," Proceedings of IEEE Ultrasonics Symposium, Oct. '83, pp 113–116). Naraine et al. discuss wide-band linear-phase SAW filters using apodized slanted or tapered finger transducers. In earlier publications, tapered finger transducer geometries have all the transducer fingers positioned along lines that emanate from a single focal point. A performance improvement was shown in U.S. Pat. Nos. 4,635,008 and 4,08,542 to Solie, the inventor of the present invention, by using hyperbolically tapered electrodes.

In Solie '008 a dispersive SAW filter comprises hyperbolically tapered input and output transducers that are aligned such that normals from the transducers to a dispersive reflective array are aligned at substantially the same angle. The dispersive reflective array includes a multiplicity of parallel conductive strips or grooves formed in the device substrate on which the transducer rests. Constant spacing between the transducer fingers causes a relatively narrow band of frequencies to be generated by the input transducer and received by the output transducer. In Solie '542, a reduction in the resistive loss associated with the long narrow electrodes in wide acoustic aperture devices is sought; a hyperbolically tapered transducer is provided with fingers having configuration paths that are subdivided into patterns that segment the acoustic beam width. Further disclosed is a means of transforming the impedance and thus reducing the insertion loss by a division of the SAW transducer structure into a plurality of subtransducers.

The use of tapered finger geometries on both input and output transducers permits the transduction of a wide range of surface acoustic wavelengths from input to output transducer, and thus provides an electrical filter with a wide frequency passband. Typically, high-frequency components are transduced in the regions of the transducer where the finger-to-finger distance is the least. Low-frequency components are transduced in the regions of the transducer where the finger-to-finger distance is the greatest. At any given frequency, a surface wave may be transmitted or received in a limited portion of the total acoustic aperture, and the width of this active portion is called the "effective aperture" of the SAW beam.

The Naraine article states that for filters employing tapered finger transducer geometries, where the electrodes or fingers are straight-line segments emanating from a single point, there is an inherent negative slope of the amplitude response with increasing frequency, as large as 5 dB for a 50% bandwidth case reported in the IEEE article. Naraine's article describes a method of flattening the amplitude-response curve of a tapered finger filter by utilizing finger apodization. Apodization is a technique in which the length of individual transducer fingers is selectively adjusted so that the overlap between fingers of opposite polarities changes along the path traveled by the surface acoustic wave.

A "tap" is defined as the gap between two adjacent electrodes. The strength of the tap, or the relative tap weight, is proportional to the voltage difference between the two electrodes. If each gap is surrounded by two electrodes of opposite polarity (hot and ground), then every tap has its maximum tap strength and has a relative tap weight of 1.0. This tap weighting is acceptable for coupling the strongest SAW in the shortest possible length of transducer; however, this configuration is not useful in making a filter with out-of-band rejection. In order to achieve useful rejection levels, the tap weights should assume predetermined values varying, for example, from 0.0 to 1.0. The technique used to achieve relative tap values is called tap weighting. Tapered transducers also need to be weighted for maximum rejection. One technique, as described above, apodization, is not applicable to tapered transducers. Three previously known techniques that are applicable to tapered transducers include withdrawal weighting, block weighting, and linewidth weighting. Linewidth weighting, wherein the electrode width is varied, cannot achieve an acceptable range in tap values owing to fabrication considerations, giving relative tap weights of approximately 0.8 to 1.0.

Another objective of the weighting technique is impedance transformation. Typically tapered transducers have very low impedance, resulting in a high insertion loss owing to the impedance mismatch between the source, which is typically 50 Ω, and the transducer, which may be <1 Ω. The impedance values of tapered transducers are low because they have wide apertures to reduce diffraction, and the impedance is inversely proportional to the aperture width. Second, tapered transducers are typically long, several hundred wavelengths or even over one thousand wavelengths. Since all taps are connected in parallel across the two bus bars, this results in a very low impedance. Withdrawal weighting, which includes the elimination of some electrodes in the previously described alternating hot-ground connection pattern, does not increase the impedance.

The last of the previously known transducer configurations, block weighting, does provide a means for increasing impedance. An exemplary unweighted transducer 80 of length N (see FIG. 1) comprises a number, here 7, of subtransducers 81–87, all in the same acoustic path and phased so that all the subtransducers are acoustically in phase with each other. This depends upon the electrical connection as well as the spacing between subtransducers. The subtransducers are arranged in strings 88–90. The subtransducers within a string are connected in series, and the strings are connected in parallel across the two major bus bars 91,92. There is always an odd number of subtransducers in a string. The block-weighted transducer 80 of FIG. 1 has 1 or 3 subtransducers per string.

Each subtransducer 81–87 in FIG. 1 is represented by a capacitive impedance element 81'–87' in FIG. 2, which shows how the voltage division within a string determines effective tap weights. The voltage across the transducer major bus bars 91,92 is now divided between the subtransducers depending upon the impedances of the three subtransducers 81–83. Since the impedance of each subtransducer is proportional to $1/n_i$ and the sum of the voltages of the three subtransducers is 1.0, the tap weights within the subtransducers are $w_i=(1/n_i)(1n_1+1/n_2+1/n_3)$. Also, $w_1+w_2+w_3=1$. Tap weighting is determined by choosing appropriate values of $n_i$. Tap weights cannot be varied within a subtransducer, making the weighting technique inherently coarse, with the rejection provided less than ideal but still useful. This is illustrated in FIG. 3, wherein a target or desired weighting function 96 is shown by the continuous curve and the result achieved by block weighting is the stepped response 97.

The set of subtransducers connected in series, i.e., the string, has two ends that are connected to the two major bus bars, and it is possible to connect several strings to a single pair of major bus bars. Typically three or four strings are used in most tapered transducers. The tap weights are determined by varying the number of subtransducers in a string and then by varying the number of taps or wavelengths within each subtransducer. The impedance transformation can be illustrated by considering the limiting case where $n_1=n_2=n_3$. Each subtransducer is only ⅓ as long as the original transducer with only ⅓ as many taps; so the impedance of each subtransducer is 3 times that of the original transducer. The string of three subtransducers has an impedance three times greater than one subtransducer; so the impedance of the string is 9 times greater than the original transducer. In general, if a single transducer is divided into a string of N equal subtransducers, then the impedance of the string is $N^2$ greater than the original transducer. Since a block-weighted transducer uses strings of subtransducers, the use of block weighting increases the transducer impedance significantly, with the amount depending upon the design of the transducer and, in particular, how many subtransducers are used in a string.

SUMMARY OF INVENTION

It is an object of the present invention to provide a weighted surface-acoustic-wave transducer with improved rejection properties.

It is another object to provide such a transducer for providing impedance transformation.

These and other objects are provided by the present invention, a weighted surface-acoustic-wave transducer String weighting is similar to block weighting; however, there are important differences. In string weighting there are a plurality of strings in a transducer, the plurality comprising the number of different tap weights within the transducer. In string weighting every subtransducer is preferably of minimal length, for example, nominally one wavelength, and there is an odd number of subtransducers in each string. The number must be odd, because the ends of the string must attach to the two bus bars. If there were an even number of subtransducers, the ends of the string would attach to the same bus bar, and there would be no voltage applied to the string. Since the full bus bar voltage is divided equally between the N subtransducers, the voltage at each tap is 1/N, and the length of the string is nominally N+1 wavelengths. Therefore, for a length of the transducer all the taps will have the same tap weight within the length of each string. This results in some degree of coarseness to the tap weighting because ideally the tap weights would be expected to change from tap to tap. However, the levels that they can assume provide at least several intermediate values between 0 and 1 with nothing in between, and this results in a degree of coarseness for withdrawal weighting, but here the taps can be changed from 0 to 1 at each tap. The net result is that the degree of coarseness for withdrawal weighting and for string weighting are about the same. Block weighting is, however, more coarse than string weighting, and as a result, string weighting can achieve better rejection.

BRIEF DESCRIPTION OF DRAWINGS

A preferred embodiment of the invention as well as alternate embodiments are described by way of example with reference to the accompanying drawings.

DETAILED DESCRIPTION OF PREFERRED EMBODIMENT

Figure 1:
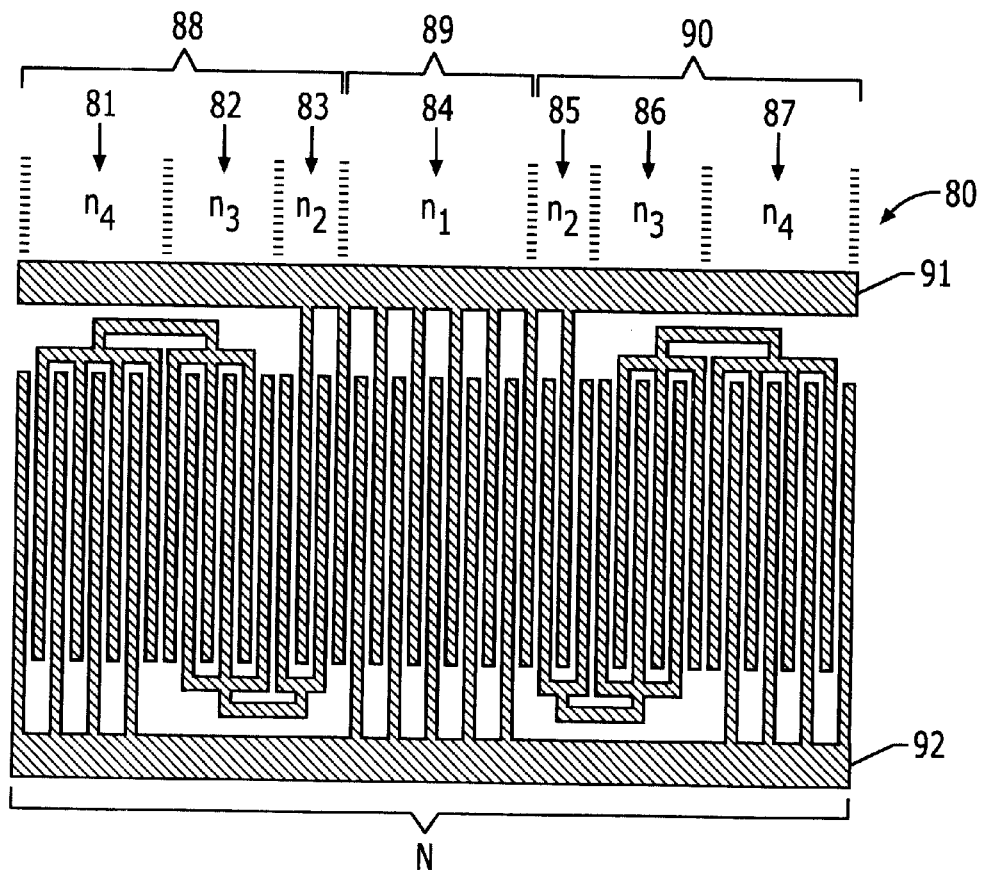
FIG. 1 (prior art) is a schematic diagram of a block-weighted transducer.
Figure 2:
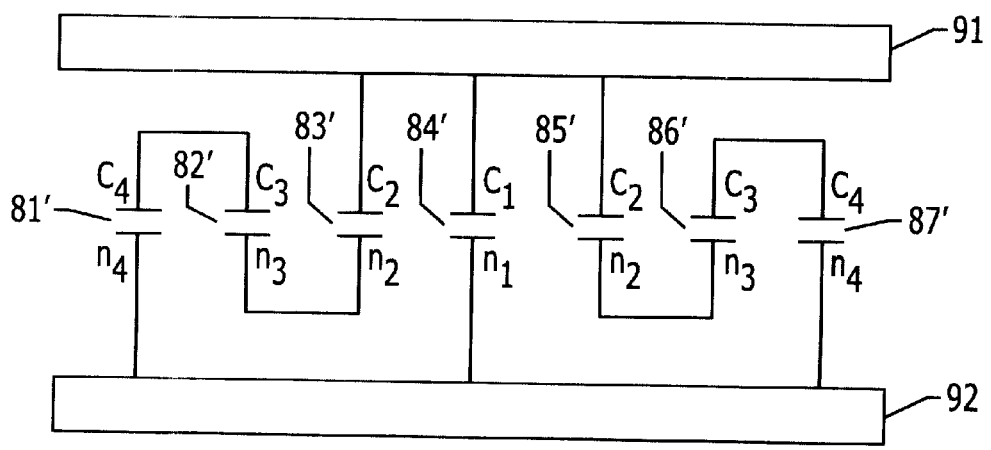
FIG. 2 (prior art) is a diagram of the subtransducers of FIG. 1 represented by impedance elements that divide the voltage between them.
Figure 3:
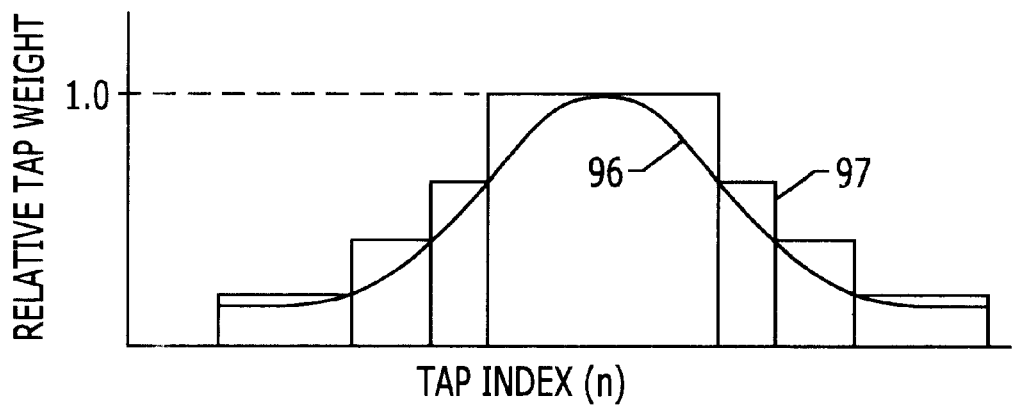
FIG. 3 (prior art) plots a target weighting function and an effective block weighting.
Figure 4:
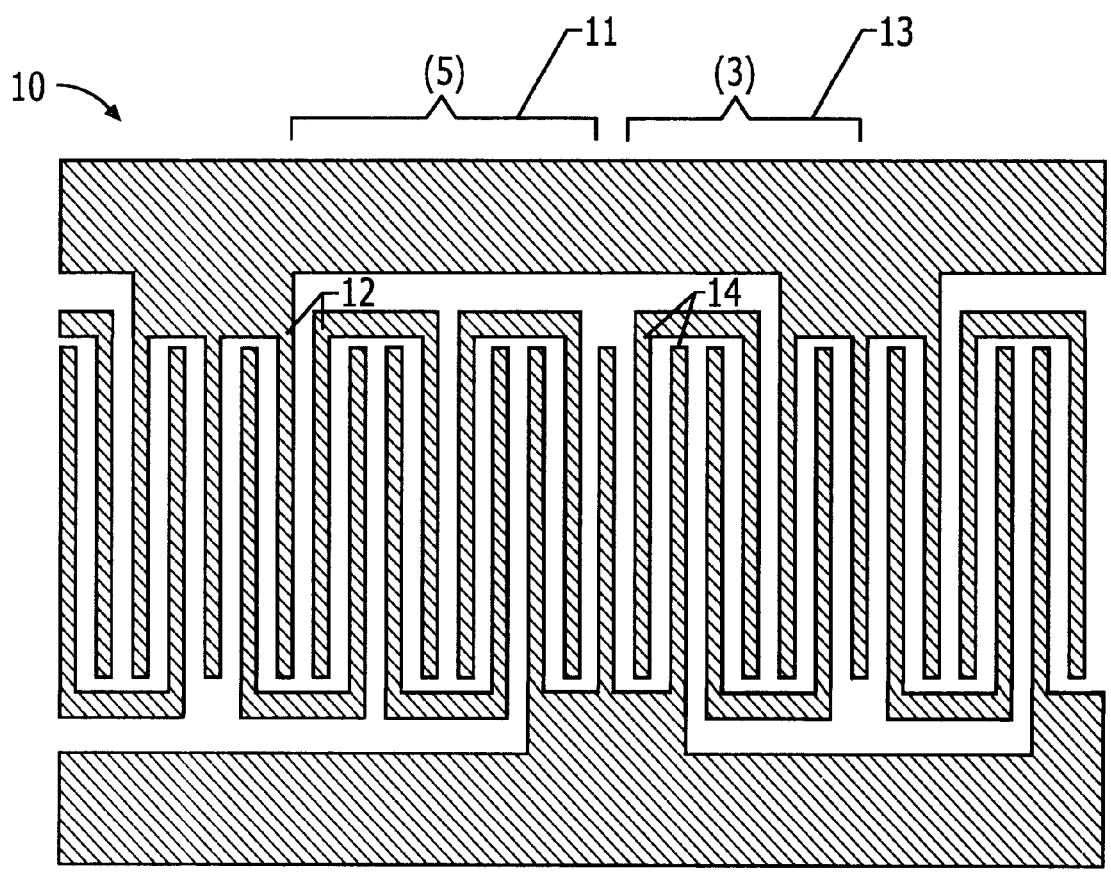
FIG. 4 is a schematic diagram of a string-weighted transducer.
Figure 5:
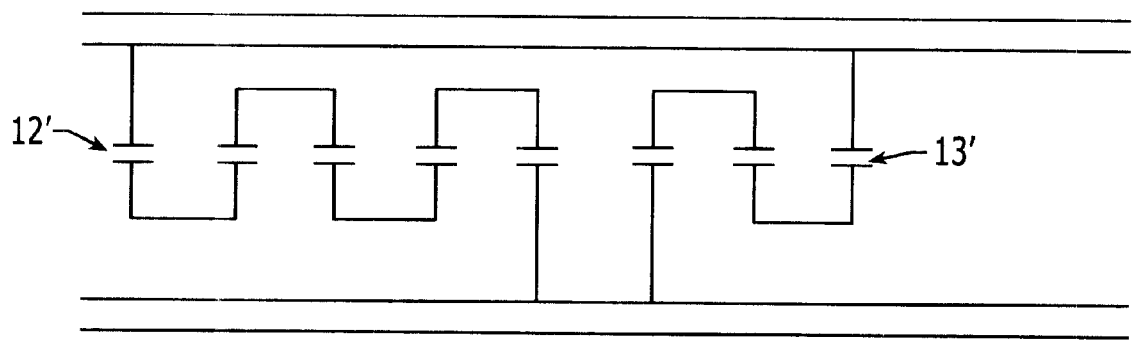
FIG. 5 is a diagram of the subtransducers of FIG. 4 represented by impedance elements that divide the voltage between them.

Preferred embodiments of the invention will now be presented with reference to FIGS. 4 and 5.

A schematic diagram illustrating a section of a string-weighted transducer 10 is presented in FIG. 4. Two strings are bracketed, the first 11 comprising five subtransducers 12 and the second 13 comprising three subtransducers 14.

A diagram of the subtransducers 12,14 represented by impedance elements 12',13' (FIG. 5) illustrates that all the taps have the same tap weight within the length of each string 11,13. The voltages at the two taps in this particular embodiment will be ⅕ and ⅓, and the lengths of the two strings are, respectively, 6 and 4 wavelengths. Each subtransducer 12,14, however, is nominally one wavelength.

It will of course be understood by one of skill in the art that alternate numbers of strings and subtransducers may be employed. It may be seen that there is a great deal of flexibility in this technique, and that virtually any number of strings and string lengths may be employed to achieve a desired result for tapered as well as other styled surface acoustic wave transducers.

While specific embodiments of the invention have been described in detail herein above, it is to be understood that various modifications may be made from the specific details described herein without departing from the spirit and scope of the invention as set forth in the appended claims.

Having now described the invention, the construction, the operation and use of preferred embodiments thereof, and the advantageous new and useful results obtained thereby, the new and useful constructions, methods of use and reasonable mechanical equivalents thereof obvious to those skilled in the art, are set forth in the appended claims.

What is claimed is:

1. A weighted surface-acoustic-wave transducer comprising:

a substrate;

a first and a second generally opposed major bus bar formed on the substrate for having voltages of opposite polarity applied thereto; and a plurality of interdigitized electrode fingers formed on the substrate, the electrode fingers grouped into a plurality of strings, each string comprising an odd number of equal length subtransducers of substantially one wavelength, wherein the subtransducers are electrically connected in series with two ends of each string connected to the major bus bars.

2. A surface-acoustic-wave transducer comprising:

two major bus bars defining an acoustic track; and a plurality of electrode fingers forming a plurality of strings within the acoustic track, wherein each string includes an odd number of subtransducers of substantially one wavelength electrically connected in series with two ends of each string connected to the two major bus bars.

3. A surface-acoustic-wave transducer as recited in claim 2, wherein the length of at least two strings differ, each string being defined by a quantity of subtransducers therein.

* * * * *